US009911472B1

(12) United States Patent
Ge et al.

(10) Patent No.: US 9,911,472 B1
(45) Date of Patent: Mar. 6, 2018

(54) WRITE BITLINE DRIVER FOR A DUAL VOLTAGE DOMAIN (71) Applicant: QUALCOMM Incorporated, San Diego, CA (US)

(72) Inventors: Shaoping Ge, Cary, NC (US); Chiaming Chai, Cary, NC (US); Stephen Edward Liles, Apex, NC (US); Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/362,795

(22) Filed: Nov. 28, 2016

(51) Int. Cl.
*G11C 7/12* (2006.01)
*G11C 7/22* (2006.01)
*G11C 7/10* (2006.01)

(52) U.S. Cl.
CPC ............... *G11C 7/12* (2013.01); *G11C 7/22* (2013.01); *G11C 7/1006* (2013.01); *G11C 7/1096* (2013.01)

(58) Field of Classification Search
CPC ... G11C 7/1096; G11C 7/1006; G11C 7/1078; G11C 11/417
USPC .................................................... 365/189.16
See application file for complete search history.

(56) References Cited

U.S. PATENT DOCUMENTS

| 8,976,607 | B2 | 3/2015 | Desai et al. |
| 9,202,555 | B2 | 12/2015 | Jung et al. |
| 9,208,860 | B2 | 12/2015 | Ngo et al. |
| 9,378,789 | B2 | 6/2016 | Hoff et al. |
| 9,401,201 | B1 | 7/2016 | Jung et al. |
| 2013/0128655 | A1* | 5/2013 | Cheng ............ G11C 8/10 365/154 |
| 2013/0294139 | A1* | 11/2013 | Terzioglu ........... G11C 7/24 365/94 |
| 2014/0254293 | A1* | 9/2014 | Desai .............. G11C 7/1096 365/189.16 |
| 2015/0213875 | A1* | 7/2015 | Tokuhiro ........ G06F 13/1689 711/106 |

* cited by examiner

*Primary Examiner* — Richard Elms
*Assistant Examiner* — Xiaochun L Chen
(74) *Attorney, Agent, or Firm* — Muncy, Geissler, Olds & Lowe, P.C.

(57) ABSTRACT

Systems and methods are directed to managing signals in a dual voltage domain comprising a high voltage domain and a low voltage domain. A write bitline driver circuit receives complementary global write bitline signals as input signals from a global write bitline driver in the low voltage domain, and a write enable signal as an input signal in the high voltage domain. The write bitline driver circuit generates complementary local write bitline signals as output signals in the high voltage domain for activating bitlines of a memory bank in the high voltage domain. The complementary local write bitline signals are based on the complementary global write bitline signals, voltage level shifted from the low voltage domain to the high voltage domain and gated by the write enable signal.

27 Claims, 5 Drawing Sheets

WRITE BITLINE DRIVER FOR A DUAL VOLTAGE DOMAIN

FIELD OF DISCLOSURE

Disclosed aspects are directed to integrated circuit designs for dual voltage domains. Specifically, exemplary aspects are directed to a local write bitline driver with built-in voltage level shifting functionality, to generate local write bitline signals in a high voltage domain based on global write bitline signals in a low voltage domain.

BACKGROUND

Computer processing systems use several kinds of memory structures. Specialized write circuitry may be used for writing data to be stored in the bit cells of the memory arrays. For example, dual voltage memory array designs include memory cells which may be placed in a high voltage domain to improve data retention, while peripheral logic such as write drivers may be placed in a low voltage domain to reduce their power consumption. Therefore, voltage level shifters may be employed to shift signals from the write drivers from the low voltage domain to the high voltage domain.

In the case of memory structures organized into multiple memory banks, conventional designs use a global write bitline driver to generate a global write bitline signal for use across multiple memory banks in the low voltage domain. The global write bitline signal is voltage level shifted, with dedicated voltage level shifters at input/output ports of each of the multiple memory banks, to convert the global write bitline signal into the high voltage domain at each memory bank. The global write bitline signal is then gated at each memory bank, for example, with a write enable signal for the memory bank, to generate the local write bitline signal for the memory bank. Such designs with multiple dedicated voltage level shifters for the multiple memory banks are expensive in terms of area and also increase both dynamic and static power consumption.

On the other hand, designing large global write bitline drivers to be placed in the high voltage domain along with the memory banks is also not a practical solution to reduce costs associated with the dedicated voltage level shifters, because such high voltage domain global write bitline drivers consume significant power and may offset any benefits that may be realized by avoiding the dedicated voltage level shifters.

Accordingly, there is a recognized need in the art for efficient and low power designs for generating local write bitline signals in the high voltage domain for the various memory banks of a memory system, while avoiding the aforementioned drawbacks of conventional designs.

SUMMARY

Exemplary aspects include systems and methods for managing signals in a dual voltage domain comprising a high voltage domain and a low voltage domain. A write bitline driver circuit receives complementary global write bitline signals as input signals from a global write bitline driver in the low voltage domain, and a write enable signal as an input signal in the high voltage domain. The write bitline driver circuit generates complementary local write bitline signals as output signals in the high voltage domain for activating bitlines of a memory bank in the high voltage domain. The complementary local write bitline signals are based on the complementary global write bitline signals, voltage level shifted from the low voltage domain to the high voltage domain and gated by the write enable signal.

For example, an exemplary aspect is directed to a method of managing signals in a dual voltage domain. The method comprises receiving complementary input signals in a first voltage domain, providing an enable signal in a second voltage domain, and generating complementary output signals in the second voltage domain, wherein the complementary output signals are based on the complementary input signals voltage level shifted from the first voltage domain to the second voltage domain and the enable signal.

Another exemplary aspect is directed to an apparatus comprising a circuit configured to receive complementary input signals in a first voltage domain, receive an enable signal in a second voltage domain, and generate complementary output signals in the second voltage domain, wherein the complementary output signals are based on the complementary input signals voltage level shifted from the first voltage domain to the second voltage domain and the enable signal.

Yet another exemplary aspect is directed to an apparatus comprising means for receiving complementary input signals in a first voltage domain, means for receiving an enable signal in a second voltage domain, and means for generating complementary output signals in the second voltage domain, wherein the complementary output signals are based on the complementary input signals voltage level shifted from the first voltage domain to the second voltage domain and the enable signal.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternative embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects are generally directed to circuits for combining voltage level shifting functionality with logic gates, an example application of which is in write bitline driver circuits used for driving bitlines (or, alternatively, word lines) of a memory array. Although the write bitline driver circuits have been explained in detail in this disclosure, it will be understood that the exemplary circuits can be equally applicable to any other dual voltage designs which have signals translated from a first voltage domain to a second voltage domain where the signals undergo further logical operations such as NAND functions before being consumed. For example, exemplary circuits may be used for any other read/write circuitry or peripheral logic associated with memory banks (e.g., read drivers). The exemplary circuits may also be employed for wordline drivers to activate a wordline of a memory bank, similar to the case of the bitline drivers which have been explained in detail in the following sections. Furthermore, aspects are described with references to a low voltage domain and a high voltage domain, but it will be understood that the disclosed aspects are equally applicable to any dual voltage domain with a first voltage domain and a second voltage domain.

Accordingly, exemplary write bitline drivers will now be described for dual voltage domain applications. An exemplary aspect includes a local write bitline driver comprising a built-in voltage level shifter for voltage level shifting between a first voltage domain (e.g., a low voltage domain) and a second voltage domain (e.g., a high voltage domain) and to provide local write bitline signals for write bitlines of a memory bank in the second voltage domain. Thus, for the memory bank in the high voltage domain, a power intensive global write bitline driver may be provisioned in the low voltage domain to reduce the power consumption of the global write bitline driver; and the local write bitline driver may integrate voltage level shifting functionality without significant area and power addition.

In exemplary aspects, a domino logic implementation of a local write bitline driver circuit comprises a voltage level shifter. A write enable signal in the high voltage domain is an input to the local write bitline driver. Complimentary global write bitline signals from the low voltage domain are also inputs to the local write bitline driver. The local write bitline driver circuit is configured to generate, as outputs in the high voltage domain, complementary local write bitline signals gated with the write enable signal. In some aspects, the write enable signal in the high voltage domain may be self-clocked or clock-like in its characteristics, while in alternative aspects, the write enable signal may be a phased signal with high and low phases, for example. In one aspect, the local write bitline signals generated by the local write bitline driver circuit may be precharged to high voltage or logic "1" using the write enable signal set to "0", e.g., when the local write bitline driver circuit is idle. The write enable signal may then be set to "1" during a write operation or an evaluate phase. The local write bitline driver circuit generates the local write bitline signals in the high voltage domain, in the evaluate phase, based on a function of the global write bitline signals in the low voltage domain and the write enable signal in the high voltage domain.

Figure 1A:
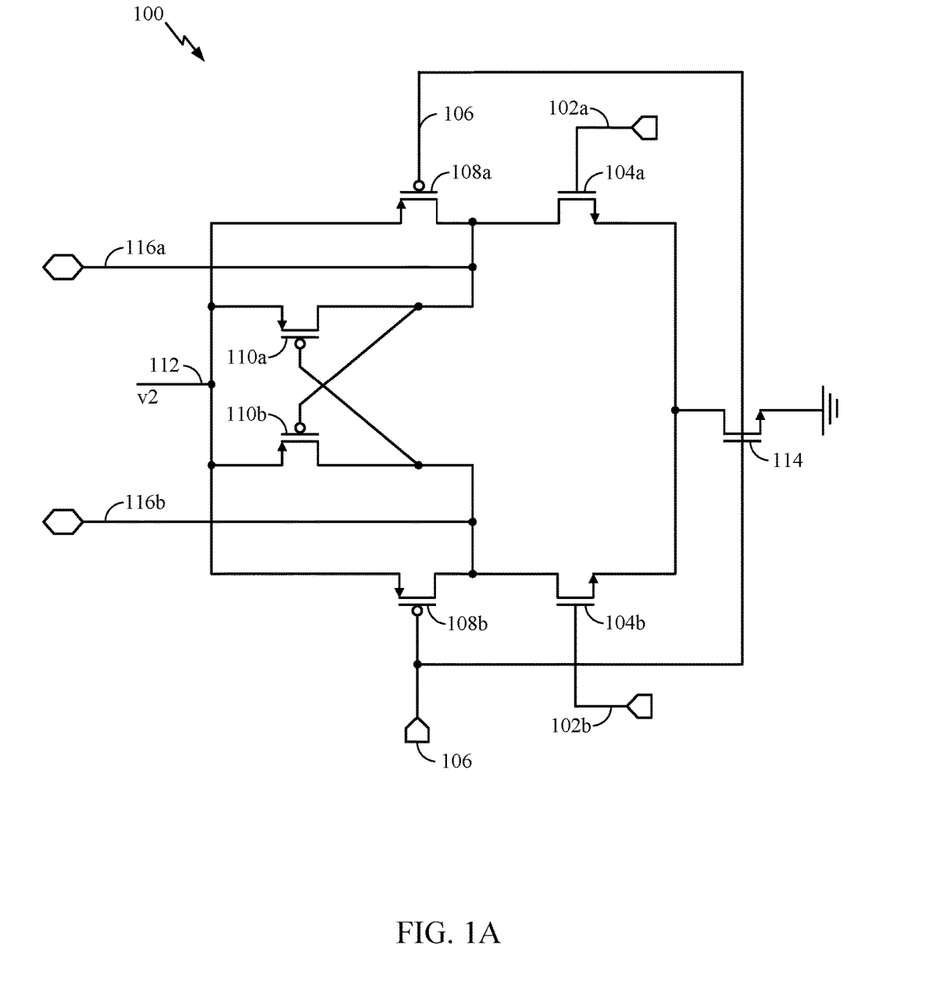
FIGS. 1A-B illustrate a circuit diagram and a corresponding signal waveform, respectively, for a write bitline driver according to an aspect of this disclosure.

With reference to FIG. 1A, circuit 100, as illustrated therein, may be configured to provide local write bitline signals, e.g., for asserting a particular bitline of a specific memory bank (not shown) of one or more memory banks of a memory array (not shown). The memory banks may be in the high voltage domain, and accordingly, the local write bitline signals may be generated in the high voltage domain from global bitline signals in the low voltage domain.

In further detail, complementary global write bitline signals 102*a-b* may be provided by a global write bitline driver (not shown) in a low voltage domain, e.g., to conserve power consumption of the global write bitline driver which may be designed with high drive strength for generating global write bitline signals to be communicated across long wires (e.g., to several memory banks). Global write bitline signals 102*a-b* may be used to drive (e.g., provided to gate terminals) n-type devices such as n-channel field effect transistors (NFETs) 104*a-b*.

As previously noted, write enable signal 106 may be a self-clocked signal (e.g., gated with a write clock) in a high voltage domain. Write enable signal 106 may be configured to drive (e.g., coupled to gate terminals) p-type devices such as p-channel field effect transistors (PFETs) 108*a-b* (in alternative aspects, write enable signal 106 may also be a phased signal, whose high and low phases, for example, may be used for turning off or on PFETs 108*a-b*). Cross-coupled PFETs 110*a-b* are cross-coupled between drain terminals of PFETs 108*a-b* and supply voltage 112 (representatively shown as "v2") in the high voltage domain. Outputs of circuit 100 are complementary local write bitline signals 116*a-b* in the high voltage domain, also derived at the drain terminals of PFETs 108*a-b*. Circuit 100 effectively includes a built-in voltage level shifter formed, for example, by NFETs 104*a-b*, PFETs 108*a-b*, and PFETs 110*a-b*. The operation of circuit 100 will now be described with reference to the timing diagram of FIG. 1B.

Figure 1B:
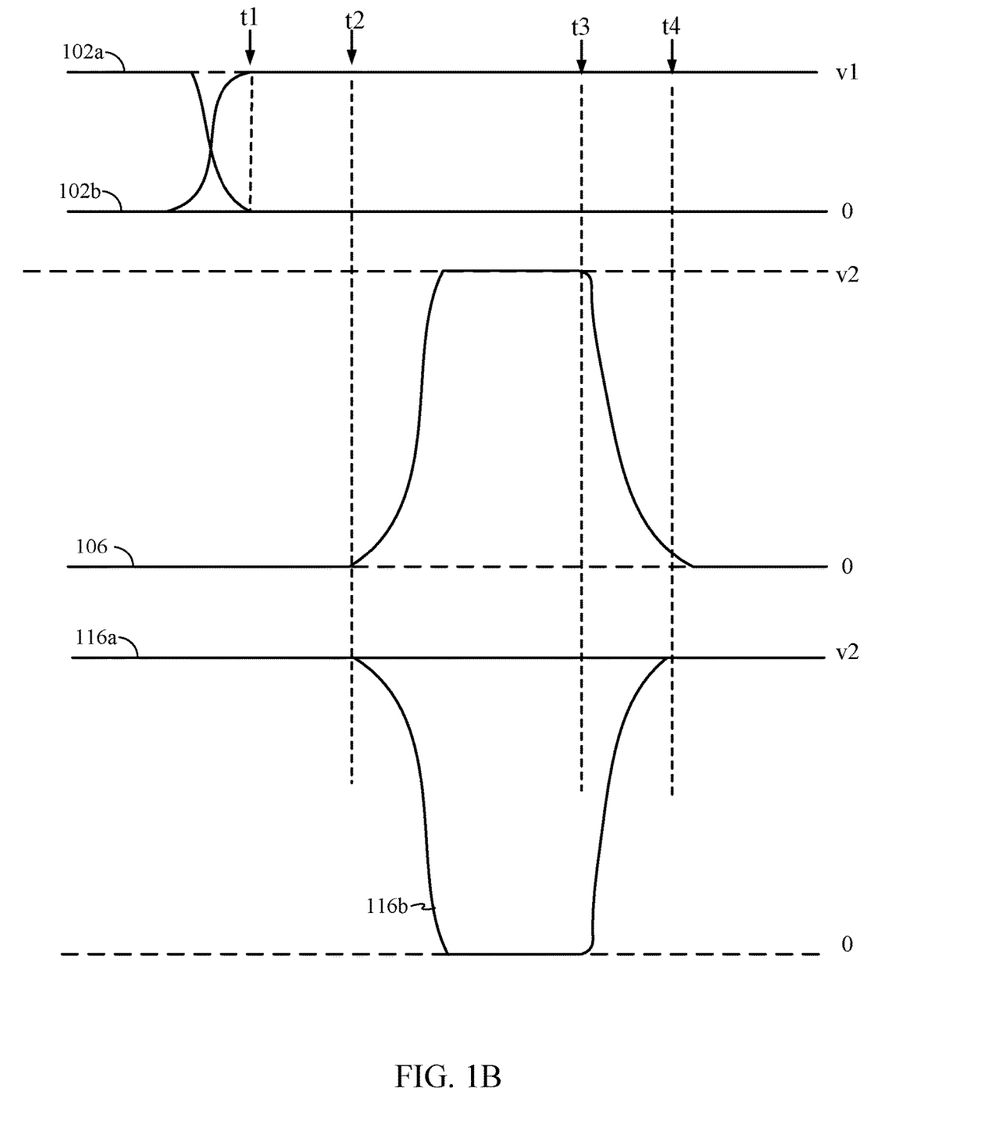

In FIG. 1B, voltage v1 is illustrated as the supply voltage of the low voltage domain and voltage v2 is illustrated as the supply voltage of the high voltage domain, as conveyed by the difference in magnitudes (e.g., as measured from voltage "0" or ground), although not drawn to scale. Global write bitline signals 102*a-b* are signals in the low voltage domain, shown to switch at time t1 to their intended values (global write bitline signal 102*a* is "0" and global write bitline signal 102*b* is "1" or v2 in this illustration).

Write enable signal 106 is initially of value "0" which turns on precharge PFETs 108*a-b*. Global write bitline signals 102*a-b* are switched to their evaluate phase when write enable signal 106 is switched to "1" or v2, with a leading edge of this pulse delayed to start at a time t2 after t1. Correspondingly, the width of the pulse (i.e., the duration of time for which write enable signal 106 is at voltage v2) may also be stretched. The delay of the leading edge and extension of the pulse width may increase if the difference between v2 and v1 increases, e.g., if v1 drops even lower, for maintaining voltage awareness of write enable signal 106 (for example, global write bitline signals 102*a-b* in the low voltage domain (v1) may be slower, and thus, the high voltage domain (v2) signals are delayed and extended to take into account these slower and later arriving low voltage domain signals).

NFET 114 is a foot switch, also driven by write enable signal 106, and thus, is turned off during the precharge phase. When write enable signal 106 changes to "1", during the evaluate phase, NFET 114 is turned on and PFETs 108*a-b* turn off. A current path is enabled through one arm of the voltage level shifter, comprising NFET 104*b* (which is turned on since global write bitline signal 102*b* is "1") and through NFET 114, and this current path pulls local write bitline 116*b* low in the high voltage domain. Correspondingly, on the other arm, PFET 110*a* is turned on to pull local write bitline 116*a* high to supply voltage 112 (v2).

At time t3, write enable signal 106 falls (e.g., the corresponding write clock may gate off write enable signal 106) and shuts off NFET 114, and soon after, at time t4, local write bitline signal 116*b* along with local write bitline signal 116*a* return to the precharge state of "1" (at voltage v2).

As previously discussed, the leading edge of write enable signal 106 may be delayed, e.g., to time t2 from time t1, to provide the low voltage domain global write bitline signals 102*a-b* sufficient setup time. The pulse-width of write enable signal 106, e.g., between time t2 and t3, may also be adjusted to accommodate the low voltage domain global write bitline signals 102*a-b*.

Further, for the correct operation of circuit 100 as a local write bitline driver, there is a need to maintain global write bitline signals 102*a-b* at the input of circuit 100 stable for the time duration between time t1 to time t4; otherwise, changes to global write bitline signals 102*a-b* during this time duration may lead to unintended changes to local write bitline signals 116*a-b* at the output of circuit 100. The hold time requirements for global write bitline signals 102*a-b* at the input of circuit 100 may be high, depending on the pulse width of write enable signal 106. In some cases, the hold time and voltage awareness for write enable signal 106 may be provided by latching the global write bitline signals 102*a-b* at the input of circuit 100, e.g., using flip-flops (not shown) configured to latch global write bitline signals 102*a-b* at the input of circuit 100. In exemplary aspects, such latching mechanism may be avoided, but related functionality may be achieved with a feedback path, for example, as will now be discussed with reference to FIG. 2.

Figure 2:
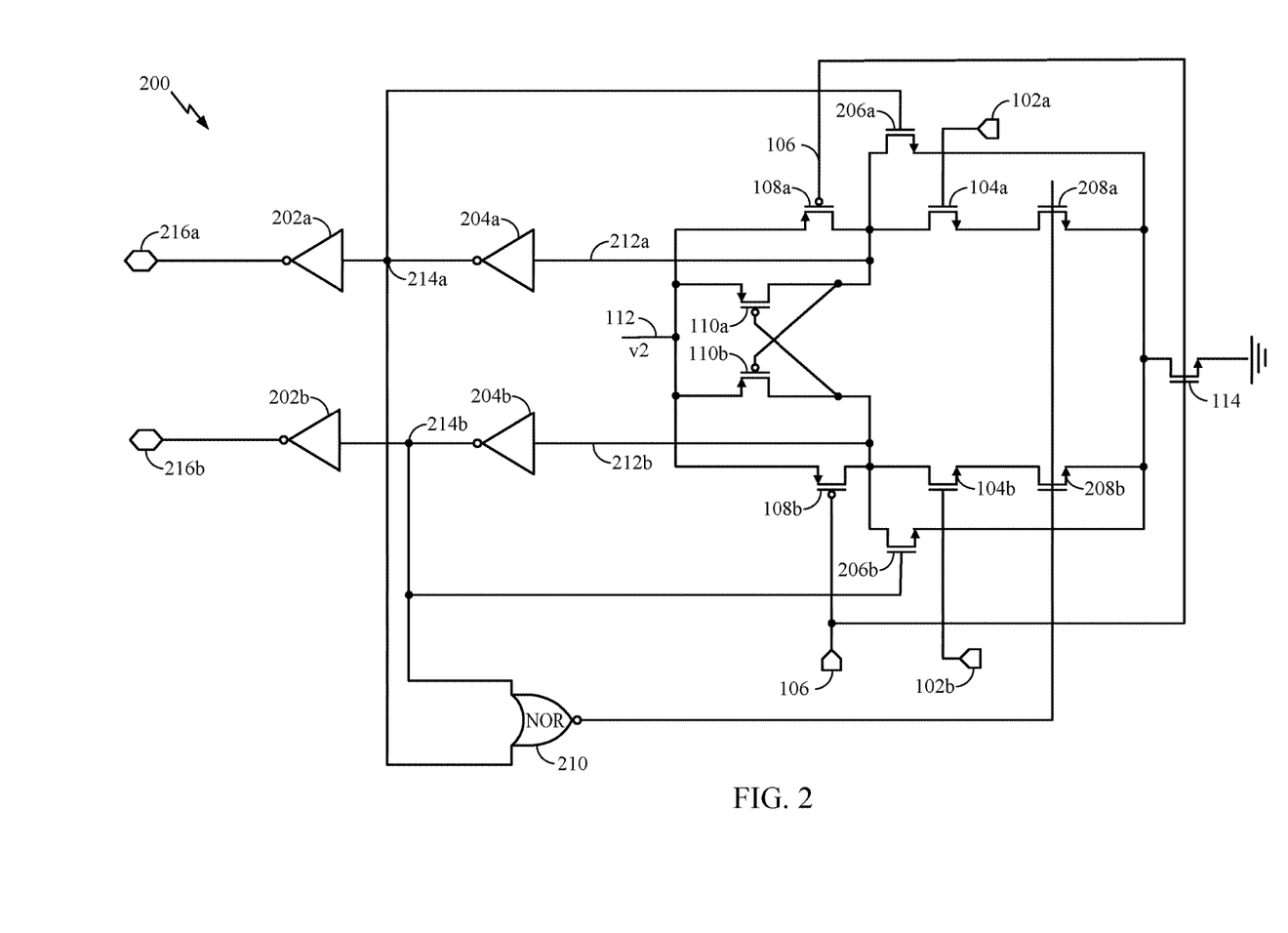
FIG. 2 illustrates an exemplary write bitline driver according to an aspect of this disclosure.

Referring to FIG. 2, circuit 200 is illustrated, which is directed to an exemplary aspect of a local write bitline driver. Circuit 200 includes aspects of circuit 100 conveyed by the use of like reference numerals for like components shown in FIG. 1A. Additional features of circuit 200 are as follows.

In circuit 200, NFETs 206*a-b* have been added to circuit 100, wherein NFETs 206*a-b* are coupled to the drain terminals of PFETs 108*a-b*. The drain terminals of PFETs 108*a-b* are shown as nodes 212*a-b* which are also coupled to inverters 204*a-b*, respectively. The outputs of inverters 204*a-b* are shown as nodes 214*a-b*. Outputs of circuit 200 are generated from nodes 214*a-b*. A feedback path is provided from the output nodes 214*a-b* back to gates of NFETs 206*a-b*, which satisfies requirements of hold time of the inputs, global write bitline signals 102*a-b*, in the following manner.

The outputs at nodes 214*a-b* are passed through NOR gate 210 and used to control gates of NFETs 208*a-b* which are coupled to drain terminals of NFETs 206*a-b*, respectively. Initially, during the precharge phase, nodes 212*a-b* are "1", which causes nodes 214*a-b* to be "0" (after having passed through inverters 204*a-b*), in turn causing the output of NOR gate 210 to be "1" and turning on NFETs 208*a-b*. Both NFET 206*a* and 206*b* are turned off during the precharge phase. In the precharge phase, circuit 200 functions similarly as circuit 100 since NFETs 208*a-b* are on.

During the evaluate phase, once nodes 212*a-b* start to evaluate (similar to evaluation of local write bitline signals 116*a-b* in FIG. 1B when write enable signal 106 is high), one of the intermediate outputs at nodes 212*a-b* starts to fall, which correspondingly causes one of nodes 214*a-b* to rise, thus causing the output of NOR gate 210 to be "0", and in turn, turning off NFETs 208*a-b*. This effectively shuts off a path to ground for NFETs 104*a-b* and so, any changes or fluctuations which may occur on global write bitline signals 102*a-b* will not affect the evaluation of nodes 212*a-b* from which the outputs of circuit 200, i.e., local write bitline signals 216*a-b*, are derived. Correspondingly, the logic value of "1" at one of nodes 214*a-b* will turn on an alternative path to ground for one of NFETs 206*a-b*, respectively, to provide a latching mechanism for nodes 212*a-b*. Accordingly, once nodes 212*a-b* start to evaluate in the evaluate phase, the values of global write bitline signals 102*a-b* may change approximately after three gate delays (i.e., caused by inverters 204*a-b*, NOR gate 210, and MFETs 208*a-b*) without affecting outputs of circuit 200, local write bitline signals 216*a-b*. In this manner, relatively long hold time requirements for global write bitline signals 102*a-b* can be avoided.

In circuit 200, inverters 204*a-b* are shown to be coupled between nodes 214*a-b* and the outputs of circuit 200, local write bitline signals 216*a-b*. However, it will be understood that inverters 204*a-b* are optional and may be used to provide additional drive strength. As shown, local write bitline signals 216*a-b* at the output of inverters 204*a-b* are derived in the high voltage domain.

Figure 3:
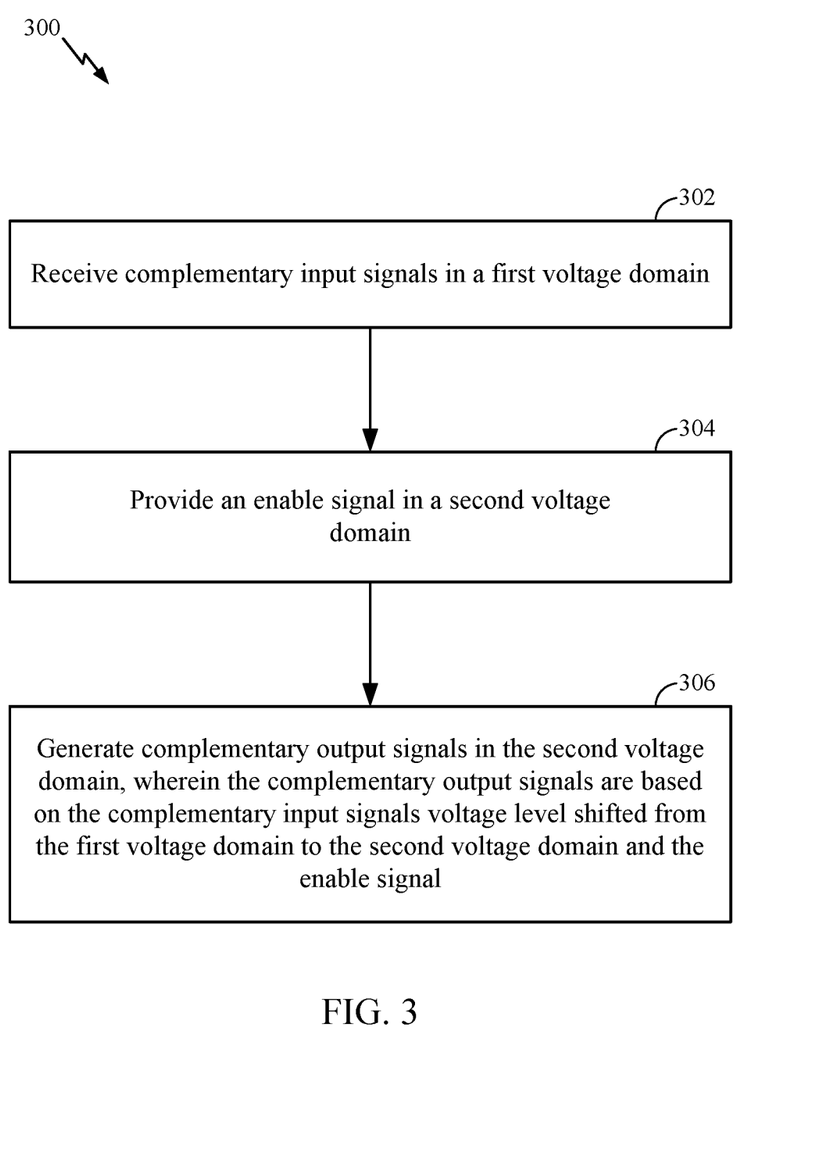
FIG. 3 is a flow-chart illustrating a method of operating a write bitline driver circuit according to an aspect of this disclosure.

It will be appreciated that exemplary aspects include various methods for performing the processes, functions and/or algorithms disclosed herein. For example, as illustrated in FIG. 3, an exemplary aspect can include a method (300) of managing signals in a dual voltage domain (e.g., a first voltage domain which is a low voltage domain and a second voltage domain which is a high voltage domain).

Block 302 comprises: receiving complementary input signals in a first voltage domain (e.g., global write bitline signals 102*a-b* in the low voltage domain).

Block 304 comprises providing an enable signal in a second voltage domain, e.g., providing write enable signal 106 in the high voltage domain, wherein write enable signal 106 may be a self-clocked write enable signal gated by a write clock, or a phased signal.

Block 306 comprises generating complementary output signals in the second voltage domain, wherein the complementary output signals are based on the complementary input signals voltage level shifted from the first voltage domain to the second voltage domain and the enable signal. For example, precharging precharge transistors (e.g., PFETs 108a-b) of a voltage level shifter (e.g., formed by PFETs 108a-b, PFETs 110a-b, and NFETs 104a-b in circuit 200) can be implemented in a precharge phase when write enable signal 106 is low and complementary output signals (e.g., local write bitline signals 216a-b) may be generated at an output of the voltage level shifter (e.g., from intermediate outputs at nodes 212a-b which may be passed through inverters 202a-b and 204a-b to provide local write bitline signals 216a-b) in an evaluate phase when write enable signal 106 is high.

In exemplary aspects, e.g., as shown in circuit 200 of FIG. 2, method 300 may further comprise avoiding fluctuations in the complementary input signals from affecting the complementary output signals in the evaluate phase by providing a feedback path from the complementary output signals to n-channel transistors (e.g., NFETs 206a-b and 208a-b) coupled to the voltage level shifter. More specifically, the feedback path may comprise inverters 204a-b coupled to output nodes (e.g., intermediate outputs at nodes 212a-b) of the voltage level shifter and outputs of the inverters 204a-b coupled to a first set of n-channel transistors (e.g., NFETs 206a-b) connected to the precharge transistors (PFETs 108a-b). The feedback path can further comprise NOR gate 210 coupled to the outputs of inverters 204a-b, and an output of the NOR gate coupled to a second set of n-channel transistors (e.g., NFETs 208a-b), wherein the second set of n-channel transistors are operated as footswitches to turn off a current path to ground during the evaluate phase. In some alternative options, avoiding fluctuations in the complementary input signals from affecting the complementary output signals in the evaluate phase may also be based on latching the complementary input signals in the first voltage domain, e.g., using flip-flops (not shown).

In exemplary aspects, the complementary input signals may be global write bitline signals 102a-b and the complementary output signals may be local write bitline signals 216a-b, wherein the global write bitline signals may be generated using a global write bitline driver in the low voltage domain, and the local write bitline signals may be provided to a memory bank to activate write bitlines of the memory bank in the high voltage domain.

In exemplary aspects, voltage awareness is provided to the exemplary circuit 200 for managing signals in a dual voltage domain, for example, by delaying a leading edge and extending a pulse width of write enable signal 106 based on a difference between voltages of the high voltage domain and the low voltage domain.

Figure 4:
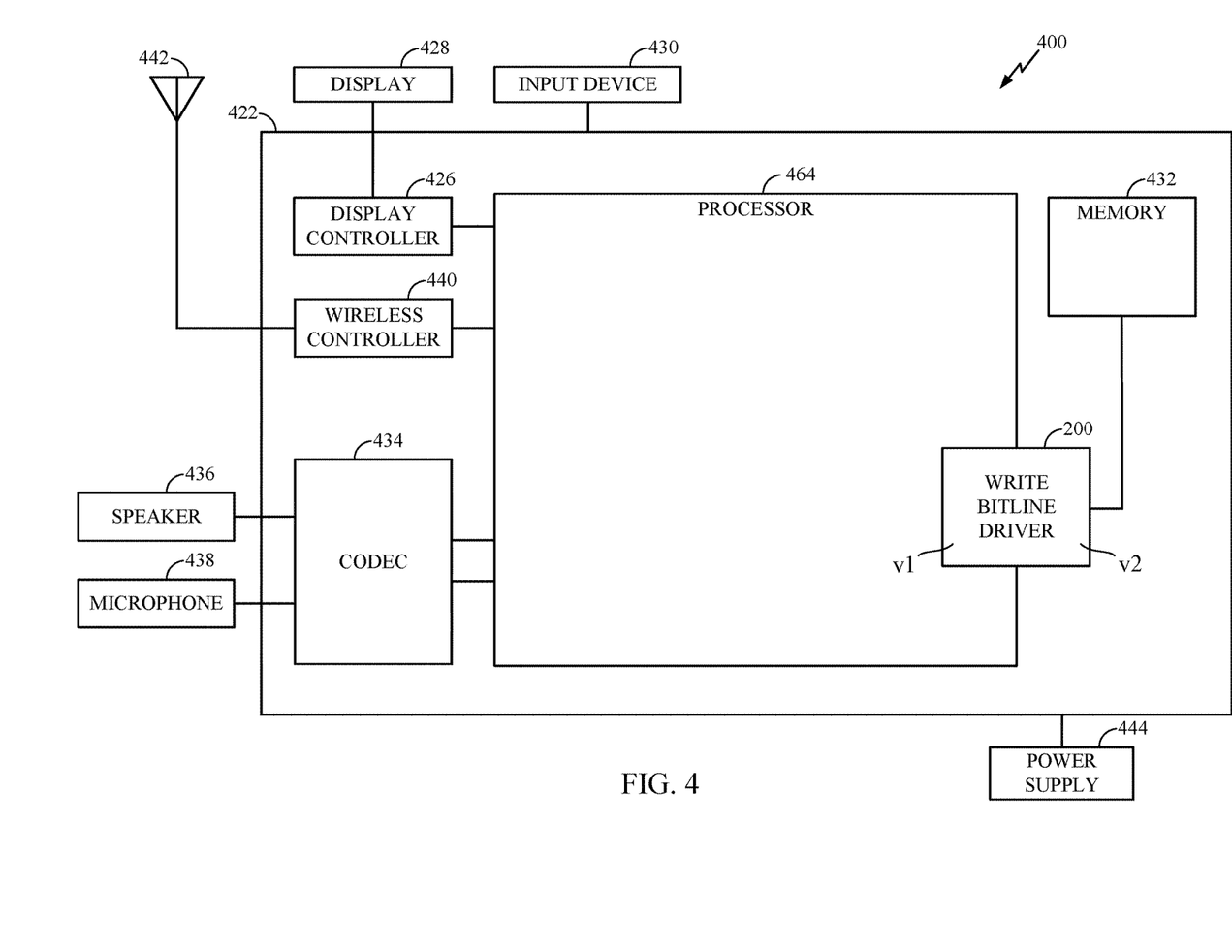
FIG. 4 illustrates an exemplary wireless device 400 in which an aspect of the disclosure may be advantageously employed.

Referring now to FIG. 4, a block diagram of a particular illustrative embodiment of a wireless device that includes a write bitline driver such as circuit 200 configured according to exemplary aspects is depicted and generally designated 400. Wireless device 400 includes processor 464 coupled to memory 432. Wireless device 400 is also shown to include exemplary circuit 200 illustrated in FIG. 2, where circuit 200 may provide voltage shifting of complementary global write bitline signals 102a-b provided by processor 464 in a first voltage domain (e.g., low voltage domain with supply voltage v1), to generate local write bitline signals 216a-b in a second voltage domain (e.g., high voltage domain with supply voltage v2). One or more arrays of memory banks comprising bit cells of memory 432 may be configured in a voltage island corresponding to the second voltage domain. Circuit 200 is shown to representatively straddle the two voltage domains v1 and v2 in FIG. 4, but it will be understood that this is merely for schematically representing aspects of this disclosure and not to be construed as a limitation in the placement/routing of hardware blocks pertaining to circuit 100.

FIG. 4 also shows display controller 426 that is coupled to processor 464 and to display 428. Coder/decoder (CODEC) 434 (e.g., an audio and/or voice CODEC) can be coupled to processor 464. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular embodiment, processor 464, display controller 426, memory 432, CODEC 434, and wireless controller 440 are included in a system-in-package or system-on-chip device 422.

In a particular embodiment, input device 430 and power supply 444 are coupled to the system-on-chip device 422. Moreover, in a particular embodiment, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 depicts a wireless communications device, processor 464, and memory 432 may also be integrated into a set-top box, a server, a music player, a video player, an entertainment unit, a navigation device, a personal digital assistant (PDA), a fixed location data unit, a mobile phone, a smart phone, or a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for managing signals in a dual voltage domain. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of managing signals in a dual voltage domain, the method comprising:
   receiving complementary input signals in a first voltage domain;
   providing an enable signal in a second voltage domain;
   generating complementary output signals in the second voltage domain, wherein the complementary output signals are based on the complementary input signals voltage level shifted from the first voltage domain to the second voltage domain and the enable signal; and
   delaying a leading edge and extending a pulse width of the enable signal based on a difference between voltages of the second voltage domain and the first voltage domain.

2. The method of claim 1, comprising precharging precharge transistors of a voltage level shifter during a precharge phase when the enable signal is low and generating the complementary output signals at an output of the voltage level shifter in an evaluate phase when the enable signal is high.

3. The method of claim 2, comprising avoiding fluctuations in the complementary input signals from affecting the complementary output signals in the evaluate phase by providing a feedback path from the complementary output signals to n-channel transistors coupled to the voltage level shifter.

4. The method of claim 3, wherein the feedback path comprises inverters coupled to output nodes of the voltage level shifter and outputs of the inverters coupled to a first set of n-channel transistors connected to the precharge transistors.

5. The method of claim 4, wherein the feedback path further comprises a NOR gate coupled to the outputs of the inverters, and an output of the NOR gate coupled to a second set of n-channel transistors, wherein the second set of n-channel transistors are operated as footswitches to turn off a current path to ground during the evaluate phase.

6. The method of claim 2, comprising avoiding fluctuations in the complementary input signals from affecting the complementary output signals in the evaluate phase by latching the complementary input signals in the first voltage domain.

7. The method of claim 1, wherein the first voltage domain is a low voltage domain and the second voltage domain is a high voltage domain.

8. The method of claim 7, wherein the complementary input signals are global write bitline signals and the complementary output signals are local write bitline signals.

9. The method of claim 8, comprising generating the global write bitline signals using a global write bitline driver in the low voltage domain, and providing the local write bitline signals to activate write bitlines of a memory bank in the high voltage domain.

10. The method of claim 1, wherein the enable signal is a self-clocked write enable signal gated by a write clock.

11. The method of claim 1, wherein the enable signal is a phased signal.

12. An apparatus comprising:
    a circuit configured to:
      receive complementary input signals in a first voltage domain;
      receive an enable signal in a second voltage domain;
      generate complementary output signals in the second voltage domain, wherein the complementary output signals are based on the complementary input signals voltage level shifted from the first voltage domain to the second voltage domain and the enable signal; and
      delay a leading edge and extend a pulse width of the enable signal based on a difference between voltages of the second voltage domain and the first voltage domain.

13. The apparatus of claim 12, wherein the circuit comprises a voltage level shifter, wherein precharge transistors of the voltage level shifter are configured to be precharged during a precharge phase when the enable signal is low and the voltage level shifter is configured to generate the complementary output signals in an evaluate phase when the enable signal is high.

14. The apparatus of claim 13, wherein the circuit comprises a feedback path from the complementary output signals to n-channel transistors coupled to the voltage level shifter, wherein the feedback path is configured to avoid fluctuations in the complementary input signals from affecting the complementary output signals in the evaluate phase.

15. The apparatus of claim 14, wherein the feedback path comprises inverters coupled to output nodes of the voltage level shifter and outputs of the inverters coupled to a first set of n-channel transistors connected to the precharge transistors.

16. The apparatus of claim 15, wherein the feedback path further comprises a NOR gate coupled to the outputs of the inverters, and an output of the NOR gate coupled to a second set of n-channel transistors, wherein the second set of n-channel transistors are operated as footswitches to turn off a current path to ground during the evaluate phase.

17. The apparatus of claim 13, wherein the circuit comprises flip-flops configured to latch the complementary input signals in the first voltage domain, to avoid fluctuations in the complementary input signals from affecting the complementary output signals in the evaluate phase.

18. The apparatus of claim 12, wherein the first voltage domain is a low voltage domain and the second voltage domain is a high voltage domain.

19. The apparatus of claim 18, wherein the complementary input signals are global write bitline signals and the complementary output signals are local write bitline signals.

20. The apparatus of claim 19, comprising a global write bitline driver in the low voltage domain configured to generate the global write bitline signal.

21. The apparatus of claim 19, wherein the local write bitline signals are configured to activate write bitlines of a memory bank in the high voltage domain.

22. The apparatus of claim 12, wherein the enable signal is a self-clocked write enable signal gated by a write clock.

23. The apparatus of claim 12, wherein the enable signal is a phased signal.

24. The apparatus of claim 12, integrated into a device selected from the group consisting of a set-top box, a server, a music player, a video player, an entertainment unit, a navigation device, a personal digital assistant (PDA), a fixed location data unit, a mobile phone, a smart phone, and a computer.

25. An apparatus comprising:
   means for receiving complementary input signals in a first voltage domain;
   means for receiving an enable signal in a second voltage domain; and
   means for generating complementary output signals in the second voltage domain, wherein the complementary output signals are based on the complementary input signals voltage level shifted from the first voltage domain to the second voltage domain and the enable signal; and
   means for delaying a leading edge and extending a pulse width of the enable signal based on a difference between voltages of the second voltage domain and the first voltage domain.

26. The apparatus of claim 25, comprising means for precharging precharge transistors during a precharge phase when the enable signal is low and means for generating the complementary output signals in an evaluate phase when the enable signal is high.

27. The apparatus of claim 26, comprising means for avoiding fluctuations in the complementary input signals from affecting the complementary output signals in the evaluate phase.

* * * * *